(12) United States Patent
Seal et al.

(10) Patent No.: US 7,183,807 B2
(45) Date of Patent: Feb. 27, 2007

(54) METHOD, APPARATUS AND SYSTEM OF DOMINO MULTIPLEXING

(75) Inventors: Chayan Kumar Seal, Beaverton, OR (US); Marijan Persun, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/879,260

(22) Filed: Jun. 30, 2004

(65) Prior Publication Data

US 2006/0001450 A1   Jan. 5, 2006

(51) Int. Cl.
  *H03K 19/096* (2006.01)
  *H03K 19/20* (2006.01)
(52) U.S. Cl. ............................ 326/95; 326/93; 326/112
(58) Field of Classification Search ............... 326/95, 326/98, 121, 112; 365/203
  See application file for complete search history.

(56) References Cited

U.S. PATENT DOCUMENTS

| | | | |
|---|---|---|---|
| 4,899,066 A * | 2/1990 | Aikawa et al. | 326/98 |
| 5,382,844 A * | 1/1995 | Knauer | 326/95 |
| 6,163,173 A * | 12/2000 | Storino et al. | 326/98 |
| 6,437,602 B1 * | 8/2002 | Friend et al. | 326/93 |
| 6,690,204 B1 * | 2/2004 | Belluomini et al. | 326/95 |

OTHER PUBLICATIONS

*Principles of CMOS VLSI Design*, by Nell Weste & Kamran Eshraghla: Chapter 5, pp. 308-309: CMOS Circuit and Logic Design: "5.4.7 CMOS Domino Logic", no date.

"The Implementation of the Itanium 2 Microprocessor" IEEE Journal of Solid-State Circuits, vol. 37, No. 11, Nov. 2002, Samuel D. Naffziger et al., pp. 1448-1460.

* cited by examiner

*Primary Examiner*—Daniel Chang
(74) *Attorney, Agent, or Firm*—Pearl Cohen Zedek Latzer, LLP

(57) ABSTRACT

Embodiments of the present invention provide a method, apparatus and system for domino multiplexing including sustaining a first domino block output in a preconditioning state using a second domino block output.

20 Claims, 4 Drawing Sheets

METHOD, APPARATUS AND SYSTEM OF DOMINO MULTIPLEXING

BACKGROUND OF THE INVENTION

In the field of Integrated Circuits (IC) a domino multiplexing circuit may be used for combining the output of two or more domino blocks.

The domino block outputs may be preconditioned during a preconditioning phase, and one of the domino blocks may be evaluated during an evaluate phase. During the evaluate phase the domino block may either remain in the preconditioned state or may transition to a non-preconditioned state, i.e., an evaluate state.

In conventional domino multiplexing each of the domino blocks is associated with an inverter and a keeper to allow maintaining the preconditioned state of the domino block during the evaluate phase.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

Figure 1:
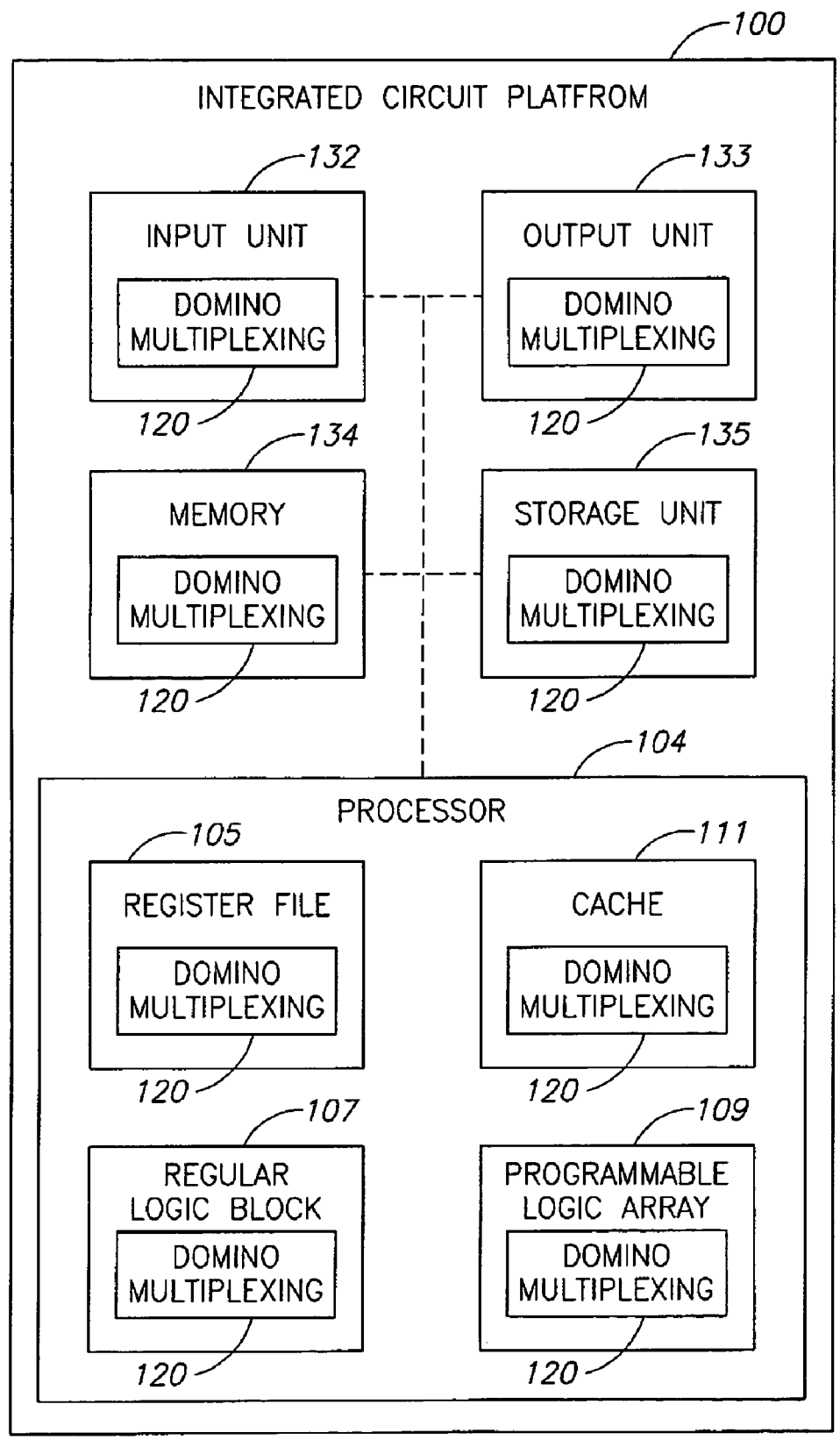
FIG. 1 is a schematic illustration of an integrated circuit platform able to perform domino multiplexing according to some exemplary embodiments of the invention.

It will be appreciated that for simplicity and clarity of illustration, elements shown in the drawings have not necessarily been drawn accurately or to scale. For example, the dimensions of some of the elements may be exaggerated relative to other elements for clarity or several physical components included in one functional block or element. Further, where considered appropriate, reference numerals may be repeated among the drawings to indicate corresponding or analogous elements. Moreover, some of the blocks depicted in the drawings may be combined into a single function.

DETAILED DESCRIPTION OF EMBODIMENTS OF THE INVENTION

In the following detailed description, numerous specific details are set forth in order to provide a thorough understanding of the invention. However, it will be understood by those of ordinary skill in the art that the present invention may be practiced without these specific details. In other instances, well-known methods, procedures, components and circuits may not have been described in detail so as not to obscure the present invention.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices. In addition, the term "plurality" may be used throughout the specification to describe two or more components, devices, elements, parameters and the like.

Reference is made to FIG. 1, which schematically illustrates an integrated circuit platform 100 able to perform domino multiplexing according to some exemplary embodiments of the present invention.

According to some exemplary embodiments, platform 100 may include a processor 104. Processor 104 may include, for example, a Central Processing Unit (CPU), a Digital Signal Processor (DSP), a microprocessor, a host processor, a plurality of processors, a controller, a chip, a microchip, or any other suitable multi-purpose or specific processor or controller.

According to some exemplary embodiments of the invention, processor 104 may include one or more register files 105, regular logic blocks 107, programmable logic arrays 109 and/or caches 111. One or more of register files 105, regular logic blocks 107, programmable logic arrays 109, caches 111 and/or any other elements of processor 104 may include one or more domino multiplexing circuits 120, as described in detail below.

According to some exemplary embodiments of the invention, platform 100 may also include an input unit 132, an output unit 133, a memory unit 134, and a storage unit 135. Platform 100 may additionally include other suitable hardware components and/or software components. In some embodiments, platform 100 may include or may be, for example, a computing platform, e.g., a personal computer, a desktop computer, a mobile computer, a laptop computer, a notebook computer, a terminal, a workstation, a server computer, a Personal Digital Assistant (PDA) device, a tablet computer, a network device, or other suitable computing device.

Input unit 132 may include, for example, a keyboard, a mouse, a touch-pad, or other suitable pointing device or input device. Output unit 133 may include, for example, a Cathode Ray Tube (CRT) monitor, a Liquid Crystal Display (LCD) monitor, or other suitable monitor or display unit.

Storage unit 135 may include, for example, a hard disk drive, a floppy disk drive, a Compact Disk (CD) drive, a CD-Recordable (CD-R) drive, or other suitable removable and/or fixed storage unit.

Memory unit 134 may include, for example, a Random Access Memory (RAM), a Read Only Memory (ROM), a Dynamic RAM (DRAM), a Synchronous DRAM (SDRAM), a Flash memory, a volatile memory, a non-volatile memory, a cache memory, a buffer, a short term memory unit, a long term memory unit, or other suitable memory units or storage units.

According to some exemplary embodiments of the invention, one or more of memory unit 134, storage unit 135, input unit 132, output unit 133, and/or any other element of platform 100 may include one or more domino multiplexing circuits 120, as described in detail below.

Figure 2:
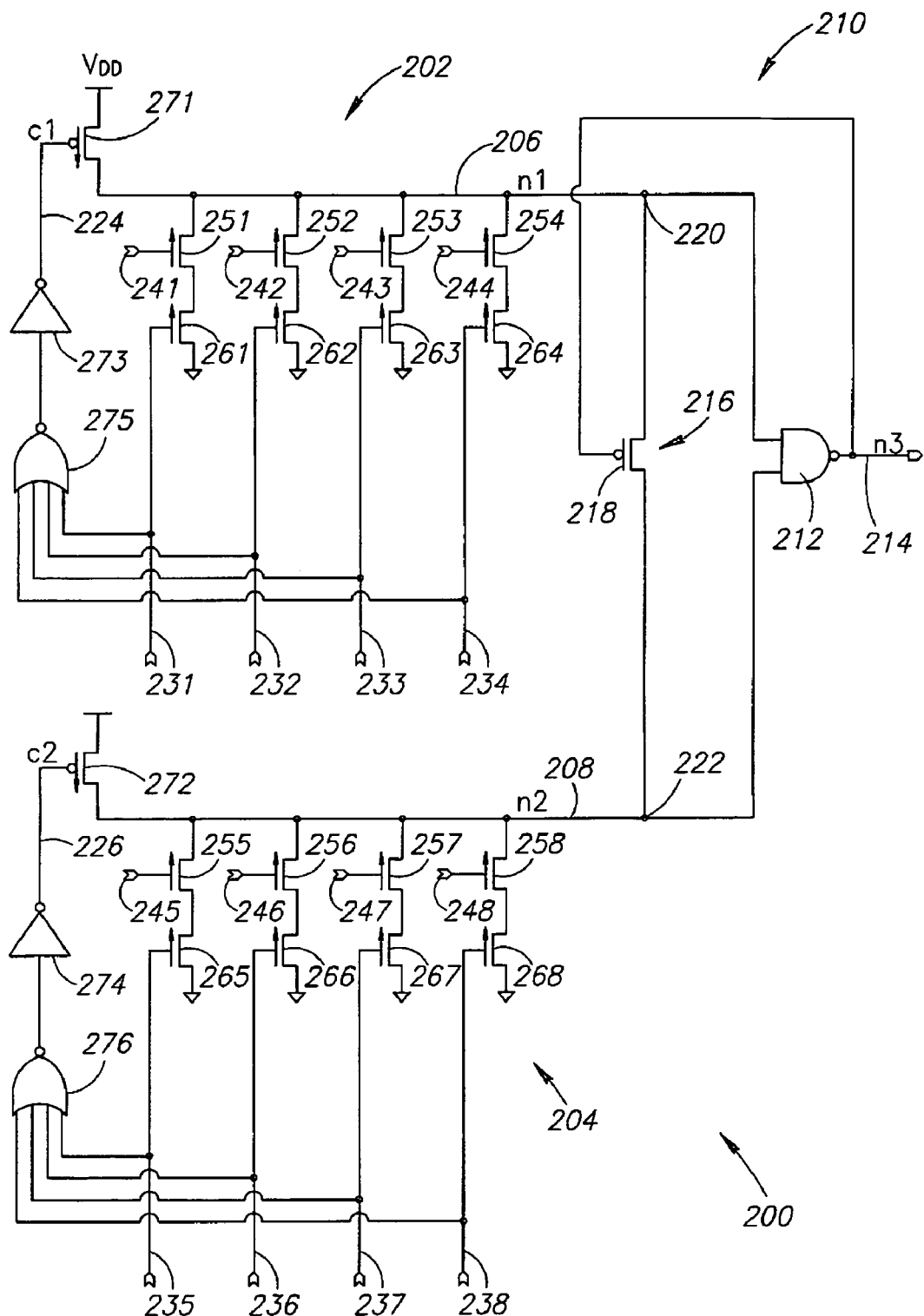
FIG. 2 is a schematic illustration of a domino multiplexing circuit according to some exemplary embodiments of the invention.

Reference is now made to FIG. 2, which schematically illustrates a domino multiplexing circuit 200 in accordance with some exemplary embodiments of the invention. Circuit 200 may be used with any suitable integrated circuit configuration, as is known in the art. For example, domino multiplexing circuit 200 may be implemented as part of a register file, a regular logic block, a programmable logic array, a cache and/or any other hardware element or circuit to perform the domino multiplexing functionality according to the invention. Although the invention is not limited in this respect, one or more of multiplexing circuits 120 in FIG. 1 may include circuit 200.

According to exemplary embodiments of the invention, circuit 200 may be adapted to receive a plurality of input signals, e.g., eight binary input signals 241–248, and to provide an output signal 214, denoted n3, e.g., having a value corresponding to the value of a selected one of the input signals, e.g. based on the value of a respective one of a plurality of selector signals, e.g., eight binary selector signals 231–238, as described below. For example, circuit 200 may be part of a register file (not shown) and input signals 241–248 may include eight respective bits received from a sector of the register file, as is known in the art.

According to exemplary embodiments of the invention, circuit 200 may include a first domino block 202 able to provide a first domino block output signal 206, denoted n1, e.g., based on input signals 241–244 and selector signals 231–234, and a second domino block 204 to provide a second domino block output signal 208, denoted n2, e.g., based on input signals 245–248 and selector signals 235–238, as described below. Circuit 200 may also include a combiner 212 adapted to produce output 214 corresponding to a combination of outputs 206 and 208, as described below.

According to exemplary embodiments of the invention, domino blocks 202 and 204 may include any suitable domino logic circuit for producing output signals 206 and 208, e.g., corresponding to the values of signals 231–234 and 235–238, respectively, for example, as is known in the art.

According to the exemplary embodiment illustrated in FIG. 2, domino block 202 and/or domino block 204 may include a pre-charged domino logic circuit, as is known in the art. For example domino block 202 may include a preconditioning element, which may be implemented, for example, by a preconditioning sub-circuit including a P-channel metal-oxide-semiconductor (PMOS) transistor 271, e.g., having a source connected to a voltage source $V_{DD}$, a drain associated with output 206 and a gate associated with an output of an inverter 273. Domino block 202 may also include a logical NOR gate 275, e.g., having four inputs to receive selector signals 231–234, respectively, and an output associated with an input of inverter 273, as is known in the art. Thus, for example, the value of an output control signal 224, denoted c1, of inverter 273 may correspond to a logical OR of signals 231–234. It will be appreciated by those skilled in the art that according to other embodiments of the invention, domino block 202 may include any other suitable configuration to produce a control signal, such as c1, for example, in accordance with the value of one or more of selector signals 231–234. For example, block 202 may include a clock generator able to generate signal c1 in accordance with one or more of selector signals 231–234. Alternatively, signal c1 may be produced by an encoding or decoding circuit, e.g., which may be used for generating one or more of selector signals 231–234, as is known in the art. Domino block 202 may also include a plurality of N-channel metal-oxide-semiconductor (NMOS) transistors, e.g., NMOS transistors 251–254, associated with signals 241–244, respectively, and a plurality of NMOS transistors, e.g., NMOS transistors 261–264 associated with selector signals 231–234, respectively, and having their sources connected to the ground, as known in the art.

According to the exemplary embodiment illustrated in FIG. 2, domino block 204 may include a domino circuit configuration analogous to the configuration of domino block 202, e.g., including a PMOS transistor 272 associated with an output signal 226, denoted c2, of an inverter 274, a logical NOR gate 276, NMOS transistors 255–258 associated with input signals 245–248, respectively, and/or NMOS transistors 265–268 associated with selector signals 235–238, respectively.

Figure 4:
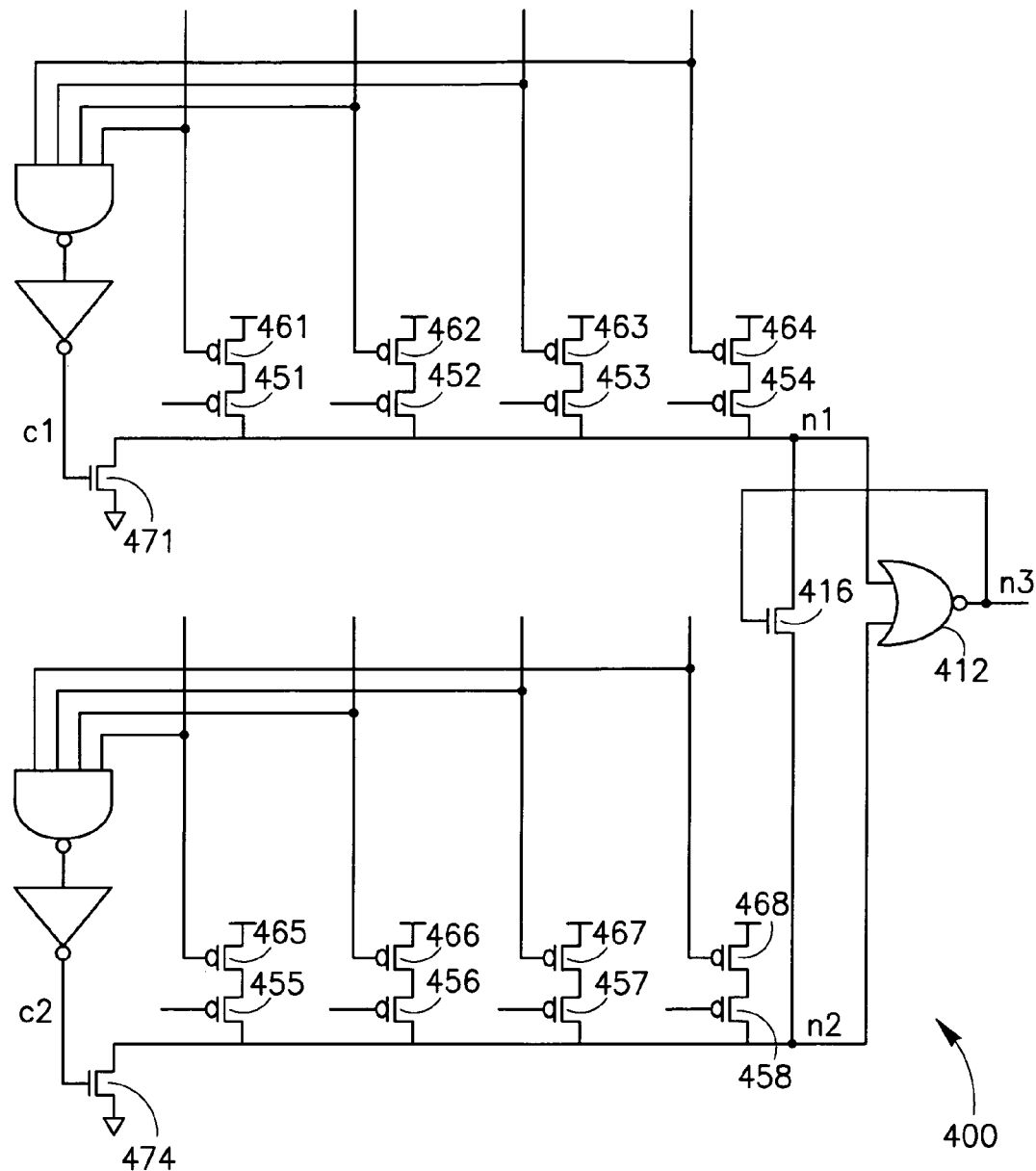
FIG. 4 is a schematic illustration of a pre-discharged domino multiplexing circuit according to some exemplary embodiments of the invention.

Although some exemplary embodiments of the invention are described herein with reference to a domino block including a pre-charged domino logic circuit, it will be appreciated by those skilled in the art that according to other embodiments of the invention, the domino block may include any other suitable domino logic circuit, e.g., a pre-discharged domino logic circuit, as is known in the art. For example, as shown in FIG. 4, domino block 202 may be modified to include a pre-discharged domino logic circuit, e.g., by replacing PMOS transistor 271 with an NMOS transistor 471, e.g., having a source connected to the ground, a drain associated with output 206 and a gate associated with an output of an inverter 273, replacing NMOS transistors 254 with PMOS transistors 451–454, respectively, and replacing NMOS transistors 261–264 with PMOS transistors 461–464 respectively, having their sources connected to the voltage source $V_{DD}$. Analogously, domino block 204 may be modified to include NMOS transistor 474, e.g. instead of transistor 274; PMOS transistors 455–458, e.g. instead of transistors 255–258, respectively; and PMOS transistors 465–468, e.g., instead of transistors 265–268, respectively.

According to the exemplary embodiment illustrated in FIG. 2, combiner 212 may include a NAND logical gate, e.g., a static Complementary Metal Oxide Semiconductor (CMOS) NAND gate, as is known in the art. According to other embodiments, combiner 212 may include any other suitable element for combining domino block outputs 206 and 208. For example, the combiner may include a NOR logical gate, e.g., a CMOS NOR gate 412 (FIG. 4), as is known in the art. Such alternative architecture may be suitable in embodiments where domino blocks 202 and 204 include the pre-discharged domino logic circuitry, e.g., as shown in FIG. 4.

According to exemplary embodiments of the invention, circuit 200 may also include a bridging arrangement 210 able to selectively connect outputs 206 and 208 based on the value of output 214, as described in detail below.

According to the exemplary embodiment of FIG. 2, bridging arrangement 210 may be able to connect outputs 206 and 208 when output 214 has a "0" value. Bridging arrangement 210 may include, for example, a PMOS transistor 216 having a source 220 and a drain 222 connected to outputs 206 and 208, respectively, and a gate 218 connected to combiner 212. According to other embodiments of the invention, bridging arrangement 210 may include any other suitable arrangement, for example, a NMOS transistor 416 (FIG. 4) having a source and a drain connected to outputs 206 and 208, respectively, and a gate connected to the output combiner 212. Such alternative architecture may be suitable in embodiments where domino blocks 202 and 204 include the pre-discharged domino logic circuitry described above with reference to FIG. 4.

According to exemplary embodiments of the invention, circuit 200 may be either in a preconditioning phase or in an evaluate phase. In the preconditioning phase, for example, both domino block outputs n1 and n2 may be pre-conditioned, i.e., signals 206 and 208 may both have a value of "1". In the evaluate phase, for example, one of domino block outputs n1 and n2 may be preconditioned and the other domino block output may be either preconditioned or evaluated, i.e., one of signals 206 and 208 may have the value of "1" and the other may either have the value of "1" or the value of "0". For example, during the preconditioning phase all selector signals may have a "0" value. Accordingly, during the preconditioning phase signals c1 and c2 may have a "0" value, and transistors 271 and 272 may be turned "on". As a result, both domino block outputs n1 and n2 may be at a preconditioned state, e.g., having value of "1", and combined output n3 may have a value of "0". Accordingly, transistor 216 may be turned "on" by signal 214, thus connecting outputs n1 and n2.

According to exemplary embodiments of the invention, during the evaluate phase one of the selector signals, e.g., signal 235, may have a value of "1" while the rest of the selector signals may have a "0" value. Accordingly, signal c1 may have a "0" value and signal c2 may have a value of "1", transistor 271 may be "on" and transistor 272 may be turned "off". As a result, output n1 may be kept at the preconditioned state, and output n2 may be either at the preconditioned state or at the evaluate state, e.g., according to the value of input signal 245, as described below.

According to exemplary embodiments of the invention, output n2 may be evaluated through transistors 255 and 265, i.e., output n2 may be discharged to the ground via transistors 255 and 265 which may be turned "on" by signals 245 and 235, respectively, e.g., if during the evaluate phase input signal 245 has a value of "1". As a result, output signal 214 may have a value of "1" which is equal to the value of the selected input signal, e.g., signal 245. Accordingly, transistor 216 may be turned "off" by signal 214 and outputs 206 and 208 may be disconnected from one another.

According to exemplary embodiments of the invention, transistor 255 may be "off" and output n2 may be maintained in the preconditioned state, i.e., output n2 may have the value of "1", e.g., if during the evaluate phase input signal 245 has a "0" value. As a result, output signal 214 may have a "0" value which is equal to the value of the selected input signal, e.g., signal 245. Accordingly, transistor 216 may be turned "on" by signal 214 and outputs 206 and 208 may be connected to each other. This may allow sustaining output 208 at the preconditioned state even though transistor 272 is turned "off", e.g., by sustaining output 208 at the preconditioned state using output 206, i.e., by associating output 208 with preconditioning transistor 271 via output 206.

It will, be appreciated by those skilled in the art that in other embodiments of the invention, the values of the domino block outputs and/or the values of the output of the combiner may have different values than the values described in the above exemplary embodiments. For example, if both domino blocks include pre-discharged domino logic circuits as described above with reference to FIG. 4 then during the preconditioned phase both domino block output signals may have the value "0" and the output of the combiner may have the value "1". Accordingly, the bridging arrangement may be turned "on", e.g., by the output of the combiner, and both domino outputs may be connected to each other. During the evaluate phase one of the domino block outputs may remain preconditioned, e.g., having the value of "0", while the other domino block output may either remain preconditioned or be evaluated, e.g., have a value of "1".

It will be appreciated by those skilled in the art that the domino multiplexing circuit according to embodiments of the invention, e.g., circuit 200, may include a smaller number of transistor elements, for example, the single transistor 216, as described above, compared to conventional domino multiplexing circuits, which may require, for example, two inverters and two "keepers" associated with each one of the domino block outputs. Additionally, the physical dimensions of the domino multiplexing circuit according to embodiments of the invention may be smaller compared to conventional domino multiplexing circuits. Accordingly, the domino multiplexing circuit according to embodiments of the invention may occupy a smaller area, and may be characterized by lower leakage power, lower total power consumption, lower switching capacitance and/or faster evaluate delay compared to conventional domino multiplexing circuits.

Figure 3:
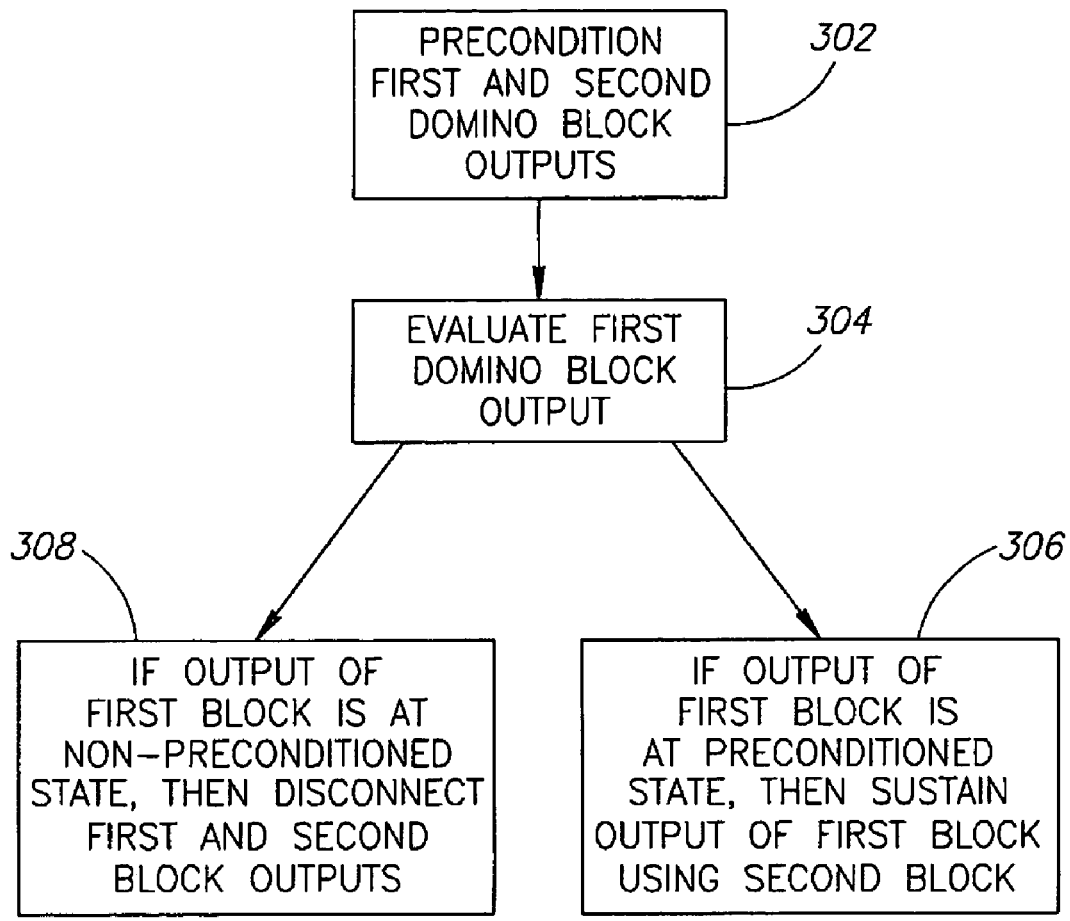
FIG. 3 is a schematic illustration of a flow chart of a method of domino multiplexing according to some exemplary embodiments of the invention.

Reference is made to FIG. 3, which schematically illustrates a method of domino multiplexing according to some exemplary embodiments of the invention.

As indicated by block 302, the method may include preconditioning the outputs of first and second domino blocks, e.g., during a preconditioning phase as described above with reference to FIG. 2.

As indicated by block 304, the method may also include evaluating the first domino block, e.g., as described above with reference to FIG. 2.

As indicated at block 306, the method may further include sustaining the output of the first domino block using the second domino block if the output of the first domino block is at a preconditioned state, e.g., during the evaluate phase. This may be achieved, for example, by using bridging arrangement 210 as described above with reference to FIG. 2.

As indicated at block 308, the method may further include disconnecting the outputs of the first and second domino blocks from one another, e.g., if the output of the first domino block is at an evaluate state.

Embodiments of the present invention may be implemented by software, by hardware, or by any combination of software and/or hardware as may be suitable for specific applications or in accordance with specific design requirements. Embodiments of the present invention may include units and sub-units, which may be separate of each other or combined together, in whole or in part, and may be implemented using specific, multi-purpose or general processors, or devices as are known in the art. Some embodiments of the present invention may include buffers, registers, storage units and/or memory units, for temporary or long-term storage of data and/or in order to facilitate the operation of a specific embodiment.

While certain features of the invention have been illustrated and described herein, many modifications, substitutions, changes, and equivalents may occur to those of ordinary skill in the art. It is, therefore, to be understood that the appended claims are intended to cover all such modifications and changes as fall within the true spirit of the invention.

What is claimed is:

1. An apparatus comprising:
   a combiner to combine an output of a first domino block and an output of a second domino block;
   a bridging arrangement able to sustain the output of said first domino block in a preconditioning state using the output of said second domino block, wherein said bridging arrangement is able to selectively connect the output of said first domino block to the output of said second domino block based on an output of said combiner.

2. The apparatus of claim 1, wherein said bridging arrangement is able to electrically connect the output of said first domino block to the output of said second domino block when said first and second domino block outputs are both at a preconditioned state.

3. The apparatus of claim 1, wherein said bridging arrangement is able to disconnect said first and second domino block outputs from one another when the output of said first domino block is at a preconditioned state and the output of said second domino block is at an evaluate state.

4. The apparatus of claim 1, wherein said bridging arrangement comprises a transistor having a source and a drain connected to the outputs of said first and second domino blocks, respectively, and a gate connected to the output of said combiner.

5. The apparatus of claim 1, wherein said combiner comprises a gate able to perform a logical NAND operation on said first and second domino block outputs.

6. The apparatus of claim 1, wherein said combiner comprises a gate able to perform a logical NOR operation on said first and second domino block outputs.

7. The apparatus of claim 1, wherein said bridging arrangement comprises a P-channel metal-oxide-semiconductor.

8. The apparatus of claim 1, wherein said bridging arrangement comprises an N-channel metal-oxide-semiconductor.

9. The apparatus of claim 1, wherein said first and second domino blocks comprise one or more pre-charged domino logic circuits.

10. The apparatus of claim 1, wherein said first and second domino blocks comprise one or more pre-discharged domino logic circuits.

11. A method comprising:
combining an output of a first domino block and an output of a second domino block; and
sustaining the output of said first domino block in a preconditioning state using the output of said second domino block,
wherein said sustaining comprises selectively connecting the output of the first domino block to the output of the second domino block based on a value resulting from said combining.

12. The method of claim 11, wherein both first and second domino blocks comprise pre-charged domino logic circuits, and wherein said selectively connecting comprises connecting between the outputs of said first and second domino blocks when said value equals zero.

13. The method of claim 11, wherein both first and second domino blocks comprise pre-discharged domino logic circuits, and wherein said selectively connecting comprises connecting between the outputs of said first and second domino blocks when said value equals one.

14. The method of claim 11, wherein said selectively connecting comprises connecting between the outputs of said first and second domino blocks when both the output of said first block and the output of said second block are at said preconditioning state.

15. The method of claim 11, wherein said selectively connecting comprises disconnecting the outputs of said first and second domino blocks from one another when the output of said first block is at said preconditioned state and the output of said second block is at an evaluate state.

16. The method of claim 11, wherein said combining comprises performing a logical NAND operation.

17. The method of claim 11, wherein said combining comprises performing a logical NOR operation.

18. An integrated circuit platform comprising
a processor able to multiplex first and second domino blocks having first and second domino block outputs, respectively, using a bridging arrangement able to sustain said first domino block output in a preconditioning state using said second domino block output,
wherein said processor comprises a combiner associated with said first and second domino block outputs and able to combine said first and second domino block outputs, and
wherein said bridging arrangement is able to selectively connect said first and second domino block outputs based on an output of said combiner.

19. The integrated circuit platform of claim 18, wherein said bridging arrangement is able to connect between said first and second domino block outputs when said first and second outputs are both at a preconditioned state.

20. The integrated circuit platform of claim 18, wherein said bridging arrangement is able to disconnect said first and second domino block outputs from one another when said first output is at a preconditioned state and said second output is at an evaluate state.

* * * * *